United States Patent [19]

Eggermont

[11] 4,016,410
[45] Apr. 5, 1977

[54] SIGNAL PROCESSOR WITH DIGITAL FILTER AND INTEGRATING NETWORK

[75] Inventor: Ludwig Désiré Johan Eggermont, Eindhoven, Netherlands

[73] Assignee: U.S. Philips Corporation, New York, N.Y.

[22] Filed: Nov. 20, 1975

[21] Appl. No.: 633,578

[30] Foreign Application Priority Data

Dec. 18, 1974 Netherlands ............. 7416480

[52] U.S. Cl. .................. 235/156; 328/167; 333/18
[51] Int. Cl.² .............. G06F 7/38; G06F 15/34
[58] Field of Search ......... 235/152, 156; 328/162, 328/167; 333/18, 28 R, 70 T

[56] References Cited

UNITED STATES PATENTS

| 3,522,546 | 8/1970 | Jackson et al. | 328/167 |
| 3,639,848 | 2/1972 | Elliott | 328/167 |
| 3,665,171 | 5/1972 | Morrow | 235/152 |
| 3,699,321 | 10/1972 | Gibson | 333/18 X |
| 3,777,130 | 12/1973 | Croisier et al. | 235/152 |
| 3,814,917 | 6/1974 | Nussbaumer | 235/152 |

OTHER PUBLICATIONS

G. B. Lockhart, "Digital Encoding and Filtering Using Delta Modulation", The Radio and Electronic Engineer, vol. 42, No. 12, Dec. 1972, pp. 547–551.

Primary Examiner—Jerry Smith
Attorney, Agent, or Firm—Frank R. Trifari; Daniel R. McGlynn

[57] ABSTRACT

System comprising an integrating digital signal processing device to which input signal samples $x(nT)$ are supplied with a period T and which supplies output signal samples $z(mrT)$ with a period $rT$. To this end in this integrating signal processing device consecutive groups having a period $rT$ and consisting of $r$ successive consecutive signal samples are processed beforehand in a non-recursive digital filter for generating auxiliary signal samples $y(mrT)$ which occur with a period $rT$, the last mentioned samples being integrated in an integrating network for generating the output signal samples $z(mrT)$.

5 Claims, 6 Drawing Figures

SIGNAL PROCESSOR WITH DIGITAL FILTER AND INTEGRATING NETWORK

BACKGROUND OF THE INVENTION

1. Field of the invention

The invention relates to a system comprising an integrating digital signal processing device for processing a sequence of binary coded signal samples $x(nT)$ which occur at a specified input sampling period T, for generating a sequence of binary coded signal samples $z(mrT)$ which occur at a specified output sampling period $rT$, $r$ being a positive integral.

Such a system may, for example, be used for converting a delta (DM) of differential pulse code (DPCM) modulated signal to a pulse code modulated (PCM) signal. To this end the DM or DPCM must first be decoded which results in integrating the DM pulses or the DPCM pulse groups. The signal samples supplied by the decoder are usually fed, through a filter for band width limitation, to a PCM coder which supplies binary coded signal samples with a sampling frequency which is considerably lower, for example a factor 8, than the sampling frequency of the DM or DPCM signal.

A system as described above may also comprise a non-recursive digital filter in which weighting factors are used which have been obtained by differential coding of the pulse response of the filter, for example, as described in U.S. Pat. No. 3,965,338 or as described by G. B. Lockhart in his article "Binary transversal filter with quantized coefficients;" Electronics Letters; June 3, 1971; Vol. 71, Nr. 11. To obtain the signal sample $z(mrT)$ the binary coded signal samples which are supplied by the said non-recursive digital filter must yet be processed (integrated) in the integrating signal processing device.

2. Description of the state of the art

A known integrating signal processing device is formed by an accumulator in which a binary coded signal sample applied to, it is each time added to the so-called contents of the accumulator, this sum constitutes the new contents of the accumulator.

Another known embodiment of an integrating signal processing device is formed by means of a first-order recursive digital filter, in which a weighting factor W is used in the recursive part.

To obtain a signal sample $z(mrT)$ at the output of the accumulator or the first-order recursive digital filter the contents thereof is each time read-out at a period T under the control of a clockpulse.

In this manner the first-order recursive digital filter supplies, for example, a signal sample $z(mrT)$ whose relation to the input signal samples $x(nT)$ of the filter is expressed by the equation.

$$z\ (mrT) = \sum_{i=0}^{mr} W^{mr-i} x\ (iT) \quad \text{where } x\ (iT) = 0 \quad (1)$$
$$\text{for } i < 0$$
$$\text{and } z\ (-T) = 0$$

In this equation:

T: is the sampling period of the signal samples $x(nT)$;
i: is the number of the signal sample $x(iT)$ occurring after the instant $t=0$;
W: is the above said weighting factor;
r: is a positive integer which indicates the output sampling period increase with respect to the input sampling period of the integrating digital signal processing device ($r$ is assumed to exceed one);
m: is a positive integer, which indicates the number of the signal samples $z(mrT)$ which occurs after the instant $t=0$ and at an integral multiple of the output sampling period $rT$.

SUMMARY OF THE INVENTION

It is an object of the invention to provide, an integrating digital signal processing device which is particularly advantageous for use in the above described system and which even at very small values of the said input sampling period T is particularly suitable to be executed in integrated form (L.S.I. integration, for example by means of I²L or MOS).

In accordance with the invention the integrating digital signal processing system comprises a non-recursive digital filter, successive signal sample groups occurring at intervals $rT$ and consisting of $r$ successive signal samples $x(uT)$ being applied to said non-recursive digital filter; said non-recursive digital filter producing successive binary coded auxiliary signal samples $y(mrT)$ in response to the successive signal sample groups applied thereto; the auxiliary signal sample occurring at time $mrT$ being related to the said group of $r$ signal samples $x(uT)$ by the expression samples:

$$y\ (mrT) = \sum_{i=0}^{r-1} W^i x\ [(mr-i)T] \quad (2)$$

said auxiliary signal samples ($y(mrT)$) being applied to an integrating network to produce said signal samples $z(mrT)$; the signal sample $z(mrT)$ at time $mrT$ being related to the said auxiliary signal samples $y(mrT)$ by the expression $$z\ (mrT) = \sum_{j=0}^{m} W^{(m-j)r} y(jrT) = W^r z\ [(m-1)rT] + y\ (mrT) \quad (3)$$

In the equations (2) and (3) W again represents the said above identified weighting factor. Furthermore U is assumed that $z\ [(m-1)rT] = O$ for $m-1 < O$ is satisfied.

To the integrating network only signal samples are applied having a period $rT$ and no longer a period T as is the case for the described, known integrating devices which are used to increase the output sampling period with respect to the input sampling period. In this way a remarkable reduction has been realized in the so-called internal processing speed of the integrating device.

REFERENCES

1. Terminology in digital signal processing, IEEE *Transactions on Audio and Electroacoustics*, Vol. AU-20. No. 5, December 1972, pages 322–337. 2. Digital processing of signals; B. Gold and C. M. Rader, McGraw-Hill Book Company 1969. 3. Digitale Systeme zur Signalverarbeitung H. W. Schussler; Springer-Verlag 1973. 4. "Quantizing Noise of Δ M/PCM Encoders; D. J. Goodman and L. J. Greenstein;" *The Bell System Technical Journal*, February 1973, Vol. 52, No. 2, pages 183 – 204. 5. "Binary transversal filters with quantized coefficients;" G. B. Lockhart, *Electronics Letters*, June 3, 1971, Vol. 7, No. 11, pages 305 – 307. 6. "Binary transversal filters using recirculating shift registers;" G. B. Lockhart and S. P. Babary; *The Radio and Electronic Engineer*, Vol. 3, March 1973.

DESCRIPTION OF THE PREFERRED EMBODIMENTS

The system in general

Figure 1:
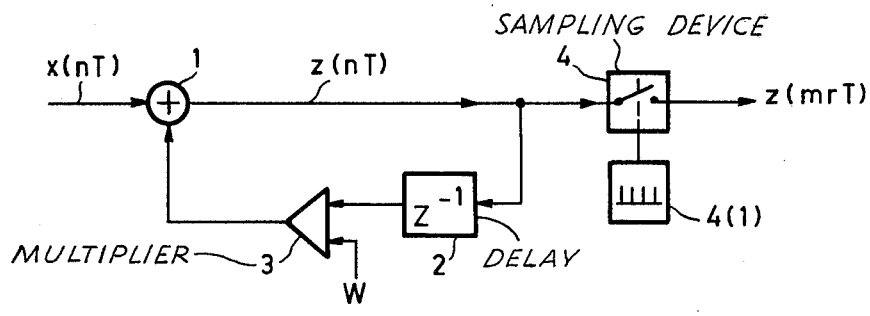
FIG. 1 shows a known embodiment of an integrating digital signal processing device.

FIG. 1 shows a known embodiment of an integrating digital signal processing device, namely in the form of a first-order recursive digital filter which is formed in known manner by an adder 1, a delay 2 and a multiplier 3 to which a weighting factor W is supplied. Via a first input a sequence of binary coded signal samples $x(uT)$ is supplied to adder 1. These signal samples $x(uT)$ occur with a period T which is called the input sampling period hereinbefore.

To realize the correct integration characteristic the delay time of the delay 2 should, as known, be chosen to be equal to the input sampling period T.

Each time after the occurrence of an input sample $x(nT)$ this integrating signal processing device supplies a binary coded output signal sample $x(nT)$.

Besides the signal samples $x(nT)$ and $z(nT)$ also the weighting factor W is usually binary coded.

Due to the feedback of $z(nT)$ to a second input of the adder 1 through multiplier 3, the samples $x(nT)$ are processed in a manner which can be mathematically expressed by the equation:

$$z(nT) = \sum_{i=0}^{n} W^{n-i} x(iT) = Wz[(n-1)T] + x(nT) \quad (4)$$

It is assumed that $x(iT)=0$ and $z(iT)=0$ for all $i<0$.

For a large number of systems used in actual practice, for example the system referred to in the preamble for converting a delta modulated signal to a PCM signal it is sufficient if only one sample $z(nT)$ of a series of r samples $z(nT)$ is available for further processing (for example for transmission to a receiver). To that end the samples $z(nT)$ are fed to an only symbolically shown sampling device 4 which is shown symbolically only. This sampling device 4 is controlled by clock pulses having a period $rT$ and which are derived from a clock pulse generator 4(1). This sampling device 4 consequently supplies the binary coded signal samples $z(mrT)$ which each, for example, represent the instantaneous value of an analog signal and which are related to the samples $x(nT)$ in the way as expressed in equation (1).

Figure 2:
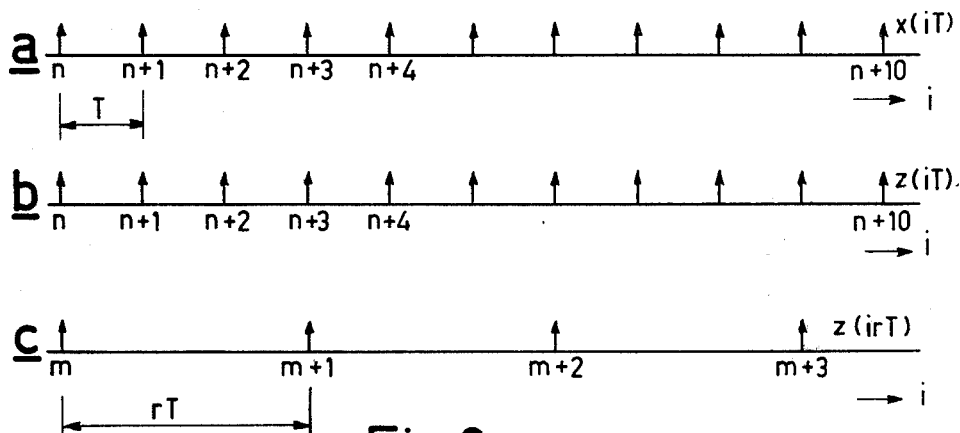
FIG. 2 shows diagrams to explain the operation of the device shown in FIG. 1.

By way of illustration FIG. 2 shows at *a* a series of samples $x(nT)$, at *b* the series of samples $z(nT)$ and at *c* the series of samples $z(mrT)$ obtained by sampling the series $z(uT)$ by means of the device 4, *r* is supposed to be equal to 3. Along the horizontal axis in these figures only the numbers of the signal samples occurring after the instant $t=0$ are indicated.

Although only one of a series of r samples $z(nT)$ is selected by the sampling device 4 for further processing, all samples $z(nT)$ should yet be calculated in order to avoid signal distortion. Consequently a sample $z(nT)$ must each time be calculated within an input sampling period T.

Especially if such an integrating signal processing device must be constructed in integrated form, for example by means of I²L or MOS and in particular if they must be integrated, with various other digital signal processing devices such as digital filters and digital modulators on a single semiconductor chip, special attention must be paid to the internal processing speed which, in known devices of this kind amounts to, for example, 12MHz.

It is an object of the invention to reduce the internal processing speed of the above described integrating digital signal processing device in which each time only one sample $z(nT)$ of a series of r samples $z(nT)$ are used for further processing.

Figure 3:
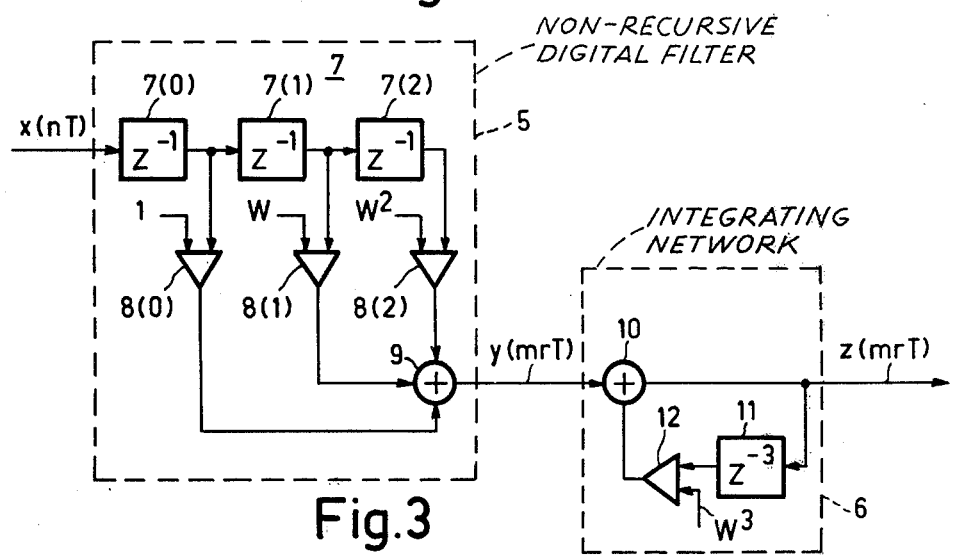
FIG. 3 shows an embodiment of the integrating digital signal processing device according to the invention.

The device according to the invention (FIG. 3)

The integrating digital signal processing device according to the invention and shown in FIG. 3 comprises a non-recursive digital filter 5 which is constructed in usual manner and whose output is connected to an input of an integrating network 6 which just as the integrating digital processing device of FIG. 1 is formed by the first-order recursive digital filter.

In particular in this FIG. 3 the factor r which indicates the increase of the output sampling period with respect to the input sampling period has been taken to be equal to 3. The non-recursive digital filter 5 is provided in known manner with a digital delay line 7 with r i.e., with three delay sections 7(0) - 7(2) which are each arranged for storing a complete signal sample $x(nT)$. These delay sections are connected in usual manner to the inputs of an adder 9 through multipliers 8(0), 8(1), 8(2). The output of this adder 9 is connected to an input of an adder 10 of the integrating network 6. This integrating network which in its construction corresponds to that shown in FIG. 1, furthermore comprises a delay device 11 and a multiplier 12. The signal samples $z(n3T)$ are derived directly from the output of adder 10.

The weighting factors which are applied to multipliers 8(0), 8(1), 8(2) have the values 1, W and $W^2$ respectively, W being equal to the weighting factor which is supplied to multiplier 3 in the device of FIG. 1. The weighting factor which is supplied to multiplier 12 of the integrating network 6 is also equal to $W^3$ or in general $W^r$.

In filter 5 successive groups of r successive signal samples $x(uT)$ are processed, said groups having a period $rT$ and said signal samples $x(nT)$ having a period T. In the embodiment of FIG. 3 where $r=3$ the groups of signal samples $\{x(0), x(T), x(2T)\}$; $\{x(3T), x(4T), x(5T)\}$; $\{...\}$; $\{x(nT), x[(n+1)T], x[(n+2)T]\}$; $\{x[(n+3)T], x[(n+4)T], x[(n+5)T]\}$ and so on, are processed in filter 5. Each of these groups supplies a binary coded auxiliary signal sample $y(mrT)$ to the output of filter 5, which samples $y(mrT)$ also consequently occur with a period $rT$, the relation between $y(mrT)$ and the associated group of r signal samples $x(nT)$ being given by the expression (2), where for this embodiment $r=3$.

In the integrating network 6 these auxiliary signal samples $y(mrT)$ are integrated in the usual manner already indicated with reference to FIG. 1. However, in contradistinction to the device of FIG. 1 the delay time of the delay device 11 has now been chosen equal to the period with which the samples $y(mrT)$ occur,; i.e., equal to $rT(=3T)$ and the weighting factor is equal to $W^r$, $(=W^3)$ connection is realized. Between $z(mrT)$ and $y(mrT)$ a relation exists which is expressed by the equation (3).

To the integrating network signal samples $y(mrT)$ are supplied which occur with a period $rT$, so that the internal processing speed of the integrating network with respect to the device shown in FIG. 1 has decreased by a factor $r$.

In the embodiment shown in FIG. 3 the auxiliary signal samples $y(mrT)$ occur with a period $rT$, however the signal samples $x(nT)$ occur with a period T and in the filter 5 therefor each sample $y(mrT)$ must be calculated within a period T. This again results in an increase of the internal processing speed of the integrating signal processing device. As, however, this increase in the internal processing speed is a result of the operations to be performed in the filter 5, this increase can be avoided, by using the measures described in U.S. Application Ser. No. 631,384, filed Nov. 12, 1975, as will be further explained with reference to FIG. 4.

DESCRIPTION OF FIG. 4

Figure 4:
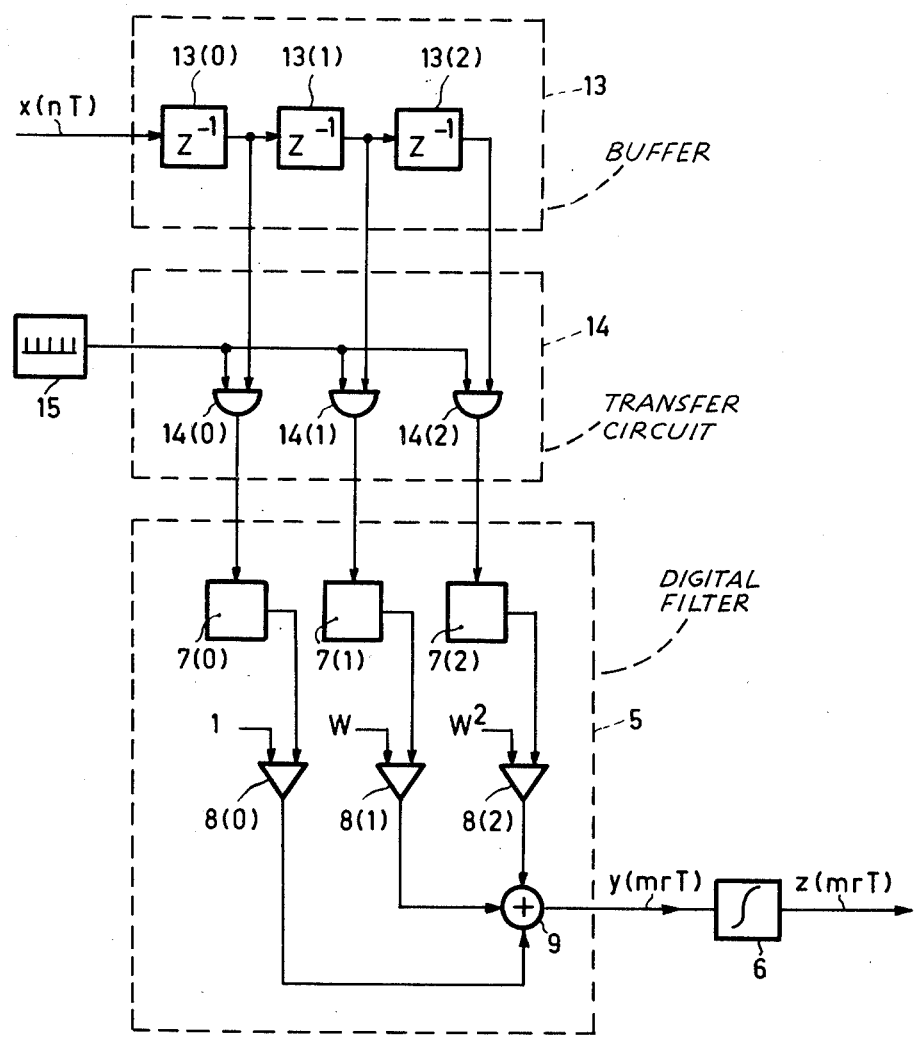
FIG. 4 shows a further embodiment of the device according to FIG. 3.

The embodiment of the integrating digital signal processing device shown in FIG. 4 corresponds to a very large extent with the device shown in FIG. 4. Elements in FIG. 4 corresponding to elements in FIG. 3 are indicated with the same reference numerals as in FIG. 3. The device shown in FIG. 4 also comprises the integrating network 6 and the digital filter 5. This filter 5 also comprises three delay sections 7(0) – 7(2) which in this case are not interconnected as in FIG. 3 three successive signal samples $x(nT)$ but herein writing in.

In this embodiment a group of three successive signal samples $x(uT)$ is first stored in a buffer 13 and then transferred to the delay sections 7(0) – 7(2). This buffer 13 is constituted by a delay line having three delay sections 13(0), 13(1) and 13(2) which are each arranged for storing a binary coded signal sample $x(nT)$ during a time which is equal to the input sampling period T. when a group of three signal samples $x(nT)$ has been written in buffer 13, for example the samples $x(nT)$, $x[(n+1)T]$, $x[(n+2)T]$, the contents of the delay sections 13(0), 13(1), 13(2) is transferred to the delay sections 7(0), 7(1) and 7(2) via a transfer circuit 14 comprising AND-gate circuits 14(0), 14(1), 14(2) and thereafter processed in the filter 5 and the integrating network 6 in the manner described before.

For the transfer of the contents of the buffer 13 to the delay sections 7(-), clockpulses are applied to the AND-gate circuits 14(.) which are derived from a clock pulse generator 15 and which occur with a period $rT$. After the contents of the buffer 13 is written in the delay sections 7(.), three new signal samples $x(nT)$ are written in the buffer 13, i.e., the samples $x[(n+3)T]$, $x[(n+4)T]$, $x[(n+5)T]$ which in their turn are transferred to the delay section 7(,) and so on.

In this manner it is achieved that the contents of the delay sections 7(.) changes only once in a period $rT$. In contradistinction to the embodiment shown in FIG. 3 a period $rT$ is available now for calculating an auxiliary signal sample $y(mrT)$ which results in a reduction of the internal processing speed of filter 5 by a factor $r$ with respect to the filter 5 shown in FIG. 3.

It is noted that the delay sections 7(0) and 13(0) respectively, can be deleted without affecting the proper operation of the devices shown in the FIGS. 3 and 4 respectively.

DESCRIPTION OF THE FIGS. 5 AND 6

The application of the integrating digital signal processing device shown in FIGS. 3 and 4 is advantageous in a device for converting, for example, a delta modulated signal into a PCM-signal or in a device for converting an analog signal to an PCM signal by means of delta modulation (see for example reference 4).

Figure 5:
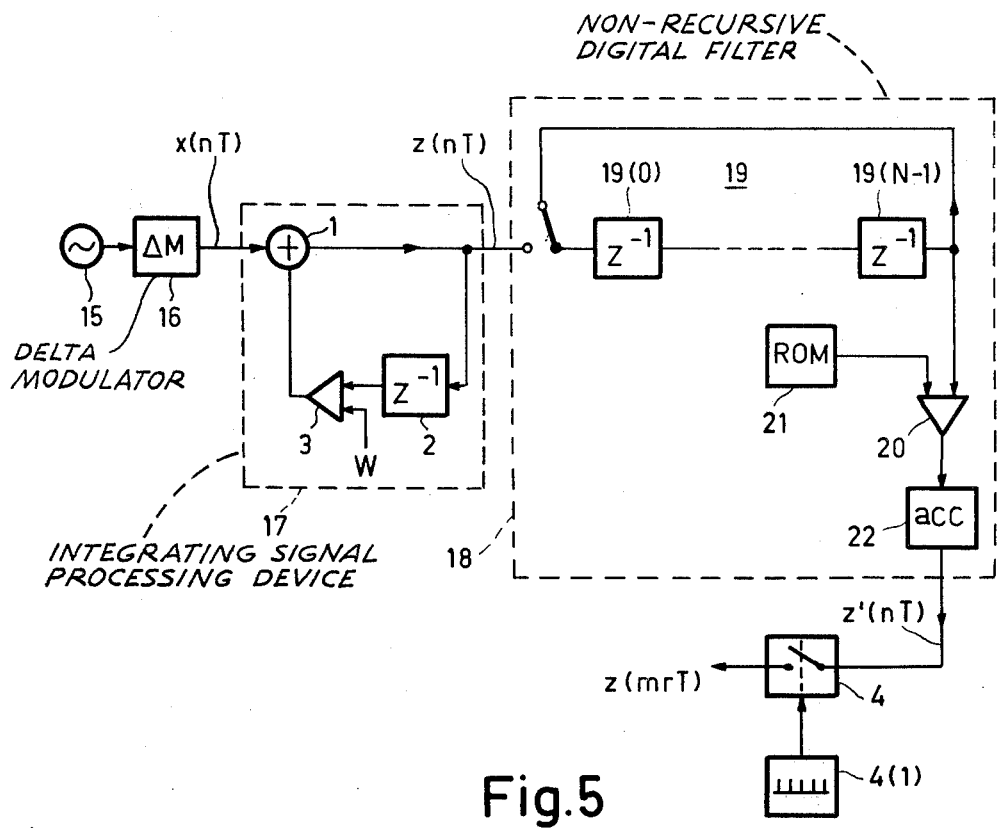
FIG. 5 shows a known embodiment of a device for converting an analog signal to a PCM signal by means of delta modulation.

FIG. 5 shows diagrammatically a digitallized embodiment of a device for converting an analog signal to a PCM signal. An equavalent device is already shown in reference 4. The analog signal is converted to a delta modulated signal. In embodiment shown, an analog signal having a bandwidth B is supplied by a source 15 and, by means of a so-called uniform delta modulator 16 converted into a series of delta pulses $x(nT)$, where T is the delta modulation sampling period and where it is assumed that $T=1/(2rB)$, where $r$ is a positive integer. These delta pulses $x(nT)$ are applied to an integrating signal processing device 17 which is constructed in the same way as the device shown in FIG. 1 and which consequently also comprises an adder 1 to which the delta pulses $x(nT)$ are applied, as well as a delay device 2 having a delay time T, and a multiplier 3 to which the weighting factor W is applied. The device 17 produces the signal samples $x(nT)$. In order not to increase the quantizing noise introduced by the delta modulator the samples $z(nT)$ again should occur with a period T. It is noted that these samples $x(uT)$ each indicate the instantaneous value of the original analog signal at the delta modulation sampling instants.

To transmit an analog signal having a bandwidth B by means of pulse code modulation (PCM), it is sufficient to sample this analog signal with a frequency 2B. Therefor it is sufficient to select in the manner as described with refrence to FIG. 1, only one signal sample $z(nT)$ of a series of $r$ successive signal samples $z(nT)$ by means of a sampling device 4 for further processing. As in FIG. 1 also now the sampling device is controlled in known manner by a clock pulse generator which supplies sampling pulses occurring with a period $rT$.

However, before the output signal of the device 17 can again be sampled by the sampling device 4, the quantizing noise which is outside the signal band of the original analog signal should be suppressed by a low pass filter 18. In the embodiment of FIG. 5 the filter 18 is constructed as a non-recursive digital filter and is of the type having a circulating delay line as described more particularly in reference (6). This filter comprises a delay device 19 which is formed by a cascade circuit of N delay sections 19(0), 19(1), . . ., 19(n-1) which are each arranged for storing a complete signal sample $x(nT)$. Furthermore this filter comprises a multiplier 20 to which besides the samples $z(nT)$ stored in the delay sections 9(.), filter coefficients $h(i)$ are applied which are supplied by a ROM 21. The output of this multiplie 20 is connected to an input of the sampling device 4 via an accumulator 22.

Since, as noted before, the samples $z(nT)$ at the output of the device 17 should occur with a period which is at the utmost equal to the input sampling period T, this device 17 cannot be replaced by one of the integrating devices which are known in the FIGS. 3 and 4.

However, as described before, the relation between the samples $z(nT)$ and the samples $x(nT)$ at respectively the ouput and the input of the integrating device 17 is given by the equation:

$$z(nT) = \sum_{i=0}^{n} W^{n-i} x(iT) = Wz[(n-1)T] + x(nT) \quad (5)$$

wherein $x(iT)=0$ and $z(iT)=0$ for all $i<0$. As the digital filter 18 performs a convolution between N signal samples $z(nT)$ and N filter coefficients $h(i)$, the relation between the input samples $z(nT)$ of the filter and an output sample $z'(nT)$ of the filter is given by the equation:

$$z'(nT) = \sum_{j=0}^{N-1} h(j) z[(n-j)T] \quad (6)$$

As, the above defined operations of integrating and filtering are linear operations, the integrating device 17 and the digital filter 18 in FIG. 5 may be interchanged. This will also be clear by substituting equation (5) into equation (6). It is found then that a sample $z'(nT)$ applied to the sampling device 4 is related to the output samples $x(nT)$ of the delta modulator 16 by the expression.

$$Z'(nT) = \sum_{p=0}^{n} W^p \sum_{j=0}^{N-1} h(j) x[(n-j-p)T] \quad (7)$$

it is again assumed that $x(iT)=0$ and $z(iT)=0$ for all $i<0$.

Figure 6:
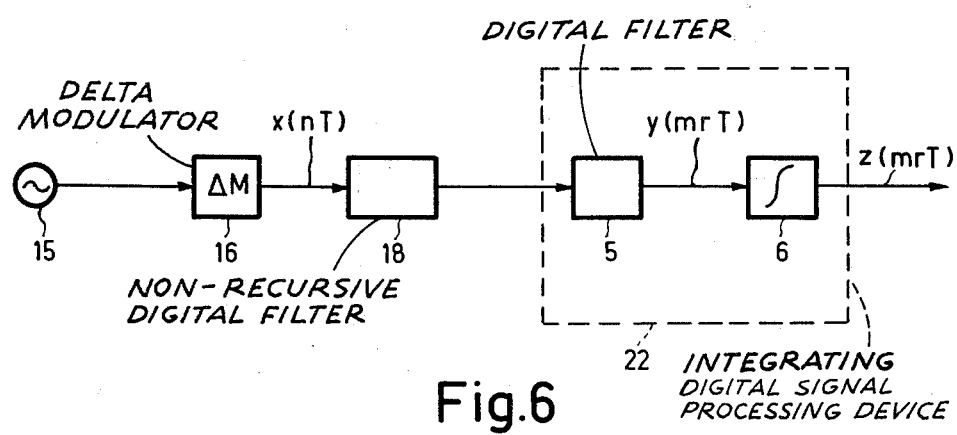
FIG. 6 shows diagrammatically the construction of the device as shown in FIG. 5 now using the steps according to the invention.

Due to said interchanging of the integrating device 17 and the digital filter 18, there are applied to the integrating device 17 signal samples occurring with a period T with a frequency spectrum in which the quantizing noise, located outside the signal band of the original analog signal is suppressed. Now the integrating device which succeeds the low pass filter can be constructed in the manner as shown in FIGS. 3 or 4. FIG. 6 shows diagrammatically the construction of the analog to PCM-converter obtained in this manner. Elements in FIG. 6 corresponding to elements in the previous Figures are indicated with the same reference numerals. The integrating digital signal processing device 22 of the system in FIG. 6 is assumed to be constructed in a manner as indicated in FIG. 3 and consequently comprises the non-recursive digital filter 5 which supplies the auxiliary signal sample $y(mrT)$ to the integrating network 6.

With respect to the device shown in FIG. 5 for converting an analog signal to a PCM signal having a sampling frequency of 2B, the device of FIG. 6 has the advantage that in the non-recursive digital filter 18 only one-bit signal samples, namely delta modulation signal samples are stored, which still results in a considerable reduction in the number of storage elements.

When the filter 18 in FIG. 6 and the filter 18 in FIG. 5 have the same transfer characteristic, then in those filters the same number (N) of signal samples must be processed and the same filter coefficients $h(i)$ must be used for both filters.

As the embodiment shown in FIG. 6 comprises a cascade arrangement of two non-recursive digital filters, namely the filters 18 and 5, these filters can be combined to a filter in which N+r-1 signal samples x(nT) are processed and in which N+r-1 filter coefficients $h'(j)$ are applied, the relation between a filter coefficient $h'(j)$ and the original filter coefficents $h(i)$ of the filter 18 being given by the equation:

$$h'(j) = \sum_{k=j-r+1}^{j} W^{j-k} h(k) \quad \text{with } 0 \leq k \leq N-1 \text{ and } 0 \leq j \leq N+r-1 \quad (8)$$

This can be seen from the following consideration the output samples of the filter 18 shown in FIG. 6 are given by $p(nT)$ then, from equation (6) it follows that the relation between $p(nT)$ and $x(nT)$ is given by the equation:

$$p(nT) = \sum_{j=0}^{N-1} h(j) x[(n-j)T] \quad (9)$$

from equation (2) it follows that the relation between $y(mrT)$ at the output of filter 5 and $x(nT)$ at the input of filter 18 are given by the equation:

$$y(mrT) = \sum_{i=0}^{r-1} W^i \sum_{k=0}^{N-1} h(k) x[(mr-i-k)T] \quad (10)$$

when in equation (10) it is assumed tht i+k=j this equation can be converted to:

$$y(mrT) = \sum_{j=0}^{N+r-2} x[(mr-j)T] \sum_{k=j-r+1}^{j} W^{j+k} h(k) \quad (11)$$

with $0 \leq k \leq N-1$ from which equation (8) follows. By using again the measures which are described in said U.S. Application Ser. No. 631,384, filed Nov. 12, 1975 for example in a manner as indicated already in the embodiment shown in FIG. 4, it can again be realized that, for calculating an output sample $y(mrT)$ by the non-recursive digital filter defined by the equation (11) a period $rT$ is available. In this manner a system has been realized for converting a uniform delta modulated signal having a sampling period T to a PCM signal having a sampling period $rT$ in which, with respect to the embodiment shown in FIG. 5 on the one hand the internal processing speed has been reduced by a factor r and in which on the other hand a considerable reduction in the required delay elements has been obtained. This will be clear from the fact that in the filter 18 shown in FIG. 5, N more-bits signal samples must be stored, for example 8-bits samples, whereas in the filter which is obtained by combining the two filters 18 and 5 shown in FIG. 6 only N+r-1 one-bit signal samples must be stored. For the case described above, i.e., when a uniform coded delta modulation signal is converted to a linear PCM-signal, the value of N is in the order of 93 and the value of r is in the order of 8.

It must be noted that the foregoing is not limited to converting a uniform delta modulated signal to a PCM signal, but that in the manner as described above, also a non-uniform delta modulation signal or a differential pulse code modulated (DPCM) signal can be converted to a PCM signal. When non-uniform delta modulation or non-uniform DPCM is used the filter 18 in the system of FIG. 6 must be constructed in a manner as indicated in U.S. Application Ser. No. 537,316, filed Dec. 30, 1974.

What has been written with respect to the embodiment shown in FIG. 6 still holds good if in the embodiment of FIG. 6 the delta modulator 16 is replaced by a PCM coder which supplies binary coded signal samples, which occur with a period T, and whereby the filter coefficients of the filter 18 are given in a differential code; i.e., that the impulse response of the filter 18 is approximated by a series of differential coded signal samples, for example a series of differential pulse code modulated signal samples (DPCM) or in the manner as described in U.S. Pat. No. 3,965,338. Now the filter coefficients represent these differential coded signal samples.

Notes

In the embodiments which are shown in the FIGS. 3 and 4, the integrating network 6 is constructed as a first-order recursive digital filter in which a weighting factor $W^r$ has been applied. If, however, a value +1 may be assigned to the weighting factor W, this first-order recursive digital filter may be replaced by a accumulator. It must also be noted that for a proper operation the integrating digital signal processing devices shown in the FIGS. 5 and 6 the integrating networks 17 and 6 respectively should have the same transfer characteristic as the corresponding integrating networks in the delta modulation devices 16.

In the above the term binary coded signal samples is used. This must be understood to mean that the signal samples are given in code words which are given in, for example, "sign-magnitude" representation or in 2-complement representation and such like. The operation of the device according to the invention, however, is independent of the way in which these code words are represented.

Finally it must be noted that the control of the various elements is done in usual manner. The control of the various embodiments can be realized by means of a single clock pulse generator. Also those clock pulses which in the embodiment shown are supplied by the generators 4(1) and 15 may be derived from said clock pulse generator. For neatness this control is not further described.

What is claimed is:
1. A signal processing device comprising
input means for supplying a sequence of input signals $x(nT)$, where n is an integer, and T a predetermined input sampling period;
digital filter means connected to said input means, and having an output for producing a sequence of binary coded auxiliary signals $y(mrT)$, having a predetermined sampling frequency relationship to said input signals given by

$$y(mrT) = \sum_{i=0}^{r-1} W^i x[(mr-1)T]$$

wherein
W is a weighting factor;
$m = 0, 1, 2, 3 \ldots$ etc.;
rT is the sampling period of said auxiliary signals; and
$x(mr-i)T = 0$ for mr-i < 0; and
an integrating network having an input connected to said output of said digital filter means, and an output for generating signal samples $z(mrT)$ related to said auxiliary signal samples by $$z(mrT) = \sum_{j=0}^{m} W^{(m-j)r} y(jrT) = W^r z[(m-1)rT] + y(mrT)$$

where
$z[(m-1)rT] = 0$ for all $m-1 < 0$.
2. The device as defined in claim 1, further comprising a non-recursive digital filter arranged for convoluting N signal samples with N filter coefficients where N is an integer, having an output connected to said input means.
3. The device as defined in claim 2, wherein said digital filter means form one non-recursive digital filter having original filter coefficients $h(k)$ arranged for convoluting $N + r - 1$ signal samples $x(nT)$ with $N + r - 1$ filter coefficients $h'(j)$, the relation between $h'(j)$ and $h(k)$ being given by the equation:

$$h'(j) = \sum_{k=j-r+1}^{j} W^{j-k} h(k)$$

where
$0 \le k \le n-1$ and $0 \le j \le N+r-1$.
4. The device as defined in claim 1, further comprising an input circuit including a storage device to which said signal samples $x(nT)$ are applied, said storage device being arranged for storing a group of r consecutive signal samples $x(nT)$ and for transferring, each time with a period rT, such group to said digital filter means.
5. The device as defined in claim 1, wherein said input signals represent a delta modulated signal, having delta modulation pulses $x(nT)$ occurring with a given input sampling period T, and said signal samples $z(mrT)$ represent a pulse code modulated signals within which pulse groups $z(mrT)$ occur with a given output sampling period rT.

* * * * *

UNITED STATES PATENT AND TRADEMARK OFFICE
CERTIFICATE OF CORRECTION

PATENT NO. : 4,016,410
DATED : April 5, 1977
INVENTOR(S) : LUDWIG DESIRE JOHAN EGGERMONT It is certified that error appears in the above-identified patent and that said Letters Patent are hereby corrected as shown below:

Column 2, line 32, "(y(mrT)" should be --y(mrT)--

Column 3, line 7, before "Digitale" insert --"-- (quotes)
line 8, after "Signalverarbeitung" insert --"-- (end quotes)

Column 6, line 64, "multiplie" should be --multiplier--

Column 8, line 31, "tht" should be --that--

Signed and Sealed this

Fourteenth Day of June 1977

[SEAL]

Attest:

RUTH C. MASON
*Attesting Officer*

C. MARSHALL DANN
*Commissioner of Patents and Trademarks*